United States Patent
Toba et al.

(10) Patent No.: US 8,508,975 B2
(45) Date of Patent: Aug. 13, 2013

(54) RESISTIVE STORAGE-BASED SEMICONDUCTOR MEMORY DEVICE

(75) Inventors: Takayuki Toba, Yokohama (JP); Hiroyuki Nitta, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 687 days.

(21) Appl. No.: 12/821,585

(22) Filed: Jun. 23, 2010

(65) Prior Publication Data
US 2011/0069524 A1 Mar. 24, 2011

(30) Foreign Application Priority Data

Sep. 24, 2009 (JP) ................................. 2009-219688

(51) Int. Cl.
*G11C 11/00* (2006.01)
(52) U.S. Cl.
USPC ............................................ 365/148; 365/63
(58) Field of Classification Search
USPC ..................... 365/63, 148, 158, 163, 171, 173
See application file for complete search history.

(56) References Cited

U.S. PATENT DOCUMENTS

| | | | | |
|---|---|---|---|---|
| 5,694,369 A | * | 12/1997 | Abe | 365/210.1 |
| 6,707,078 B1 | * | 3/2004 | Shiraiwa et al. | 257/208 |
| 7,301,815 B2 | * | 11/2007 | Kurata et al. | 365/185.2 |
| 8,144,500 B2 | * | 3/2012 | Kono | 365/148 |
| 8,406,036 B2 | * | 3/2013 | Kono | 365/148 |
| 2007/0217263 A1 | | 9/2007 | Fasoli et al. | |
| 2008/0239932 A1 | | 10/2008 | Kamata et al. | |
| 2009/0137112 A1 | | 5/2009 | Tabata et al. | |
| 2011/0204309 A1 | | 8/2011 | Nitta | |
| 2011/0233505 A1 | | 9/2011 | Nitta | |

FOREIGN PATENT DOCUMENTS

| | | |
|---|---|---|
| JP | 2003-100754 | 4/2003 |
| JP | 2004-39150 | 2/2004 |
| JP | 2004-110867 | 4/2004 |
| JP | 2004-356313 | 12/2004 |
| JP | 2007-149170 | 6/2007 |
| JP | 2008-276904 | 11/2008 |
| JP | 2008-306045 | 12/2008 |

OTHER PUBLICATIONS

Notice of Reasons for Rejection issued Jan. 10, 2012 in Japanese Patent Application No. 2009-219688 (with English translation).

* cited by examiner

*Primary Examiner* — Harry W Byrne
*Assistant Examiner* — Lance Reidlinger
(74) *Attorney, Agent, or Firm* — Oblon, Spivak, McClelland, Maier & Neustadt, L.L.P.

(57) ABSTRACT

A semiconductor memory device includes a control circuit. The control circuit applies a first voltage to a selected one of a upper interconnections, applies a second voltage to an unselected one of the upper interconnections, applies a third voltage to a first dummy upper interconnection and independently controls the first to third voltages to be set to different values.

17 Claims, 12 Drawing Sheets

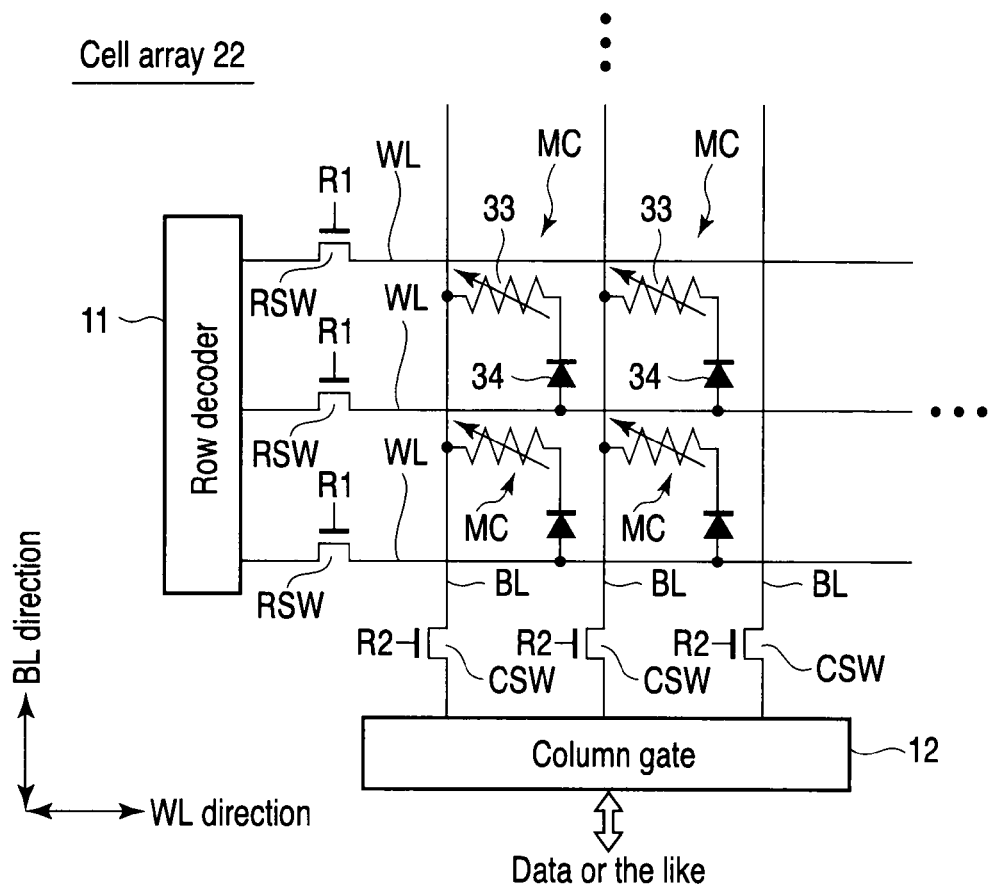
F I G. 2
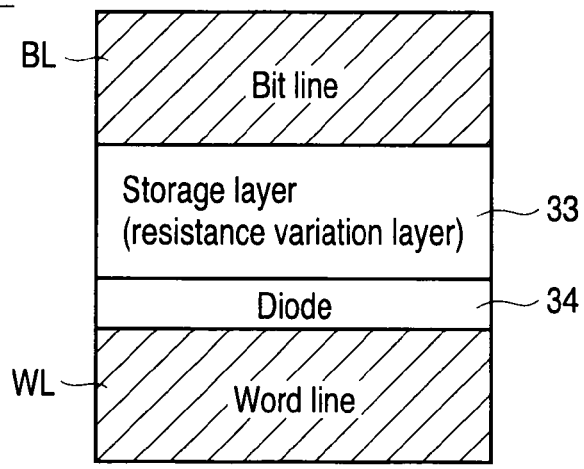
F I G. 3

Relation between respective interconnections and names of cells

|      | BL                   | DBL0                          | DBL1,2                        |
|------|----------------------|-------------------------------|-------------------------------|
| WL   | MC (memory cell)     | DMCB1 (second dummy cell)     | DMC (fourth dummy cell)       |
| DWL0 | DMCW1 (first dummy cell) | DMCBW1 (fifth dummy cell) | DMCW2 (seventh dummy cell)    |
| DWL1,2 | DMC (third dummy cell) | DMCB2 (sixth dummy cell)  | DMCBW2 (eighth dummy cell)    |

F I G. 6

Relation between cell size and application voltage

IV characteristic of diode

Voltage relation in word line direction

| WL | | DWL0 | DWL1,2 |
|---|---|---|---|
| Selected | Unselected | | |
| VWL-s (first voltage) | VWL-ns (second voltage) | VDWL0 (third voltage) | VDWL1,2 (seventh voltage) |

$$\left( \begin{array}{c} \text{VWL-s} \\ \text{(first voltage)} \end{array} < \begin{array}{c} \text{VDWL0} \\ \text{(third voltage)} \end{array} < \begin{array}{c} \text{VDWL1,2} \\ \text{(seventh voltage)} \end{array} \leq \begin{array}{c} \text{VWL-ns} \\ \text{(second voltage)} \end{array} \right)$$

F I G. 10

Voltage relation in bit line direction

| BL | | DBL0 | DBL1,2 |
|---|---|---|---|
| Selected | Unselected | | |
| VBL-s (fourth voltage) | VBL-ns (fifth voltage) | VDBL0 (sixth voltage) | VBWL1,2 (eighth voltage) |

$$\left( \begin{array}{c} \text{VBL-s} \\ \text{(fourth voltage)} \end{array} > \begin{array}{c} \text{VDBL0} \\ \text{(sixth voltage)} \end{array} > \begin{array}{c} \text{VBWL1,2} \\ \text{(eighth voltage)} \end{array} \geq \begin{array}{c} \text{VBL-ns} \\ \text{(fifth voltage)} \end{array} \right)$$

F I G. 11

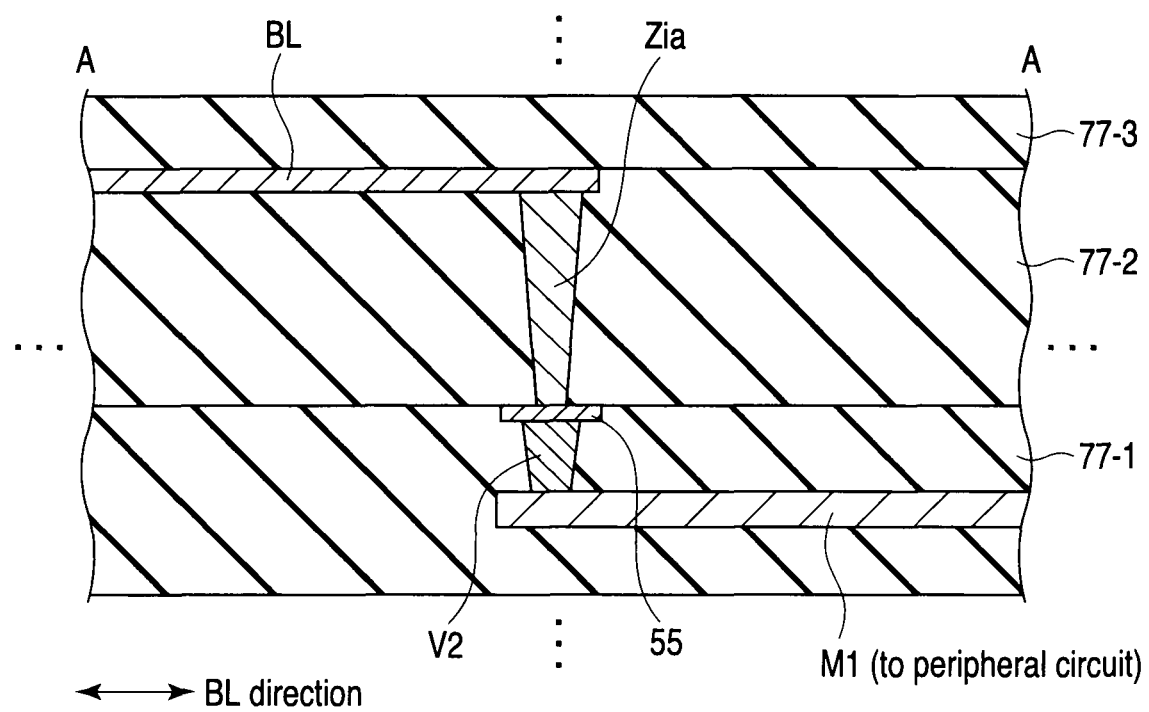
F I G. 14

RESISTIVE STORAGE-BASED SEMICONDUCTOR MEMORY DEVICE

CROSS-REFERENCE TO RELATED APPLICATIONS

This application is based upon and claims the benefit of priority from prior Japanese Patent Application No. 2009-219688, filed Sep. 24, 2009, the entire contents of which are incorporated herein by reference.

BACKGROUND OF THE INVENTION

1. Field of the Invention
This invention relates to a semiconductor memory device.
2. Description of the Related Art
Recently, much attention is paid to semiconductor memory devices such as ReRAMs (Resistive RAMs), PCRAMs (Phase Change RAMs), MRAMs (Magnetic RAMs, Magneto-resistive RAMs) and Fuse/Anti-Fuse RAMs with resistive storage elements as next-generation candidates of successors in place of flash memories that are nonvolatile semiconductor memory devices of low cost and large memory capacity (for example, see Jpn. Pat. Appln. KOKAI Publication No. 2008-276904).

BRIEF SUMMARY OF THE INVENTION

A semiconductor memory device according to an aspect of the present invention comprising: a plurality of upper interconnections; a plurality of lower interconnections, a first dummy upper interconnection with line width larger than that of the upper interconnection; memory cells arranged in intersecting positions between the upper interconnections and the lower interconnections; first dummy cells arranged in intersecting positions between the first dummy upper interconnection and the lower interconnections; and a control circuit that applies a first voltage to a selected one of the upper interconnections, applies a second voltage to an unselected one of the upper interconnections, applies a third voltage to the first dummy upper interconnection and independently controls the first to third voltages to be set to different values.

A semiconductor memory device according to an another aspect of the present invention comprising: a plurality of upper interconnections; a plurality of lower interconnections, a first dummy upper interconnection arranged in a same level as the upper interconnections and having line width larger than that of the upper interconnection; memory cells arranged in intersecting positions between the upper interconnections and the lower interconnections, the memory cells being laminated in a direction perpendicular to a substrate surface of a semiconductor substrate into a 3-dimensional structure by alternately laminating the plural upper interconnections and plural lower interconnections; first dummy cells arranged in intersecting positions between the first dummy upper interconnection and the lower interconnections; and a control circuit that applies a first voltage to a selected one of the upper interconnections, applies a second voltage to an unselected one of the upper interconnections, applies a third voltage to the first dummy upper interconnection and independently controls the first to third voltages to be set to different values.

BRIEF DESCRIPTION OF THE SEVERAL VIEWS OF THE DRAWING

FIG. 2 is an equivalent circuit diagram showing a cell array of the semiconductor memory device according to the first embodiment;

FIG. 3 is a cross-sectional view showing a memory cell and dummy memory cell according to the first embodiment;

FIG. 6 is a diagram showing the relation between respective interconnections of the semiconductor memory device according to the first embodiment and the names of cells;

FIG. 10 is a diagram showing the voltage relation in a word line direction of the semiconductor memory device according to the first embodiment;

FIG. 11 is a diagram showing the voltage relation in a bit line direction of the semiconductor memory device according to the first embodiment;

FIG. 14 is a cross-sectional view taken along the A-A line of FIG. 13; and

DETAILED DESCRIPTION OF THE INVENTION

In a cross-point memory cell array of the next-generation semiconductor memory device, the size of a memory cell comprising a storage element and resistive element may vary depending on the width of an interconnection in some cases. In this case, it is particularly difficult to form an interconnection in the peripheral portion of the memory cell array to have the same size as that of an interconnection in the central portion thereof and the interconnection tends to be formed thick due to the difference in density.

The electrical characteristic of the memory cell tends to vary depending on the width of the interconnection. Therefore, even if the same voltage is applied, different operations may be performed in the central portion and peripheral portion of the memory cell array. As a result, in the next-generation semiconductor memory device, various operations including a data write operation tend to be unstable.

Next, embodiments of this invention will be explained with reference to the accompanying drawings. In the explanation, a case wherein a ReRAM (Resistive Random Access Memory) is used as a semiconductor memory device is explained, but this invention is not limited to this case. In the explanation, common reference symbols are attached to common portions throughout the drawings.

First Embodiment

A semiconductor memory device according to a first embodiment of this invention is explained with reference to FIGS. 1 to 9.

1. Configuration Example 1-1. Whole Configuration Example:

First, the whole configuration example of the semiconductor memory device according to the first embodiment is explained with reference to FIG. 1.

Figure 1:
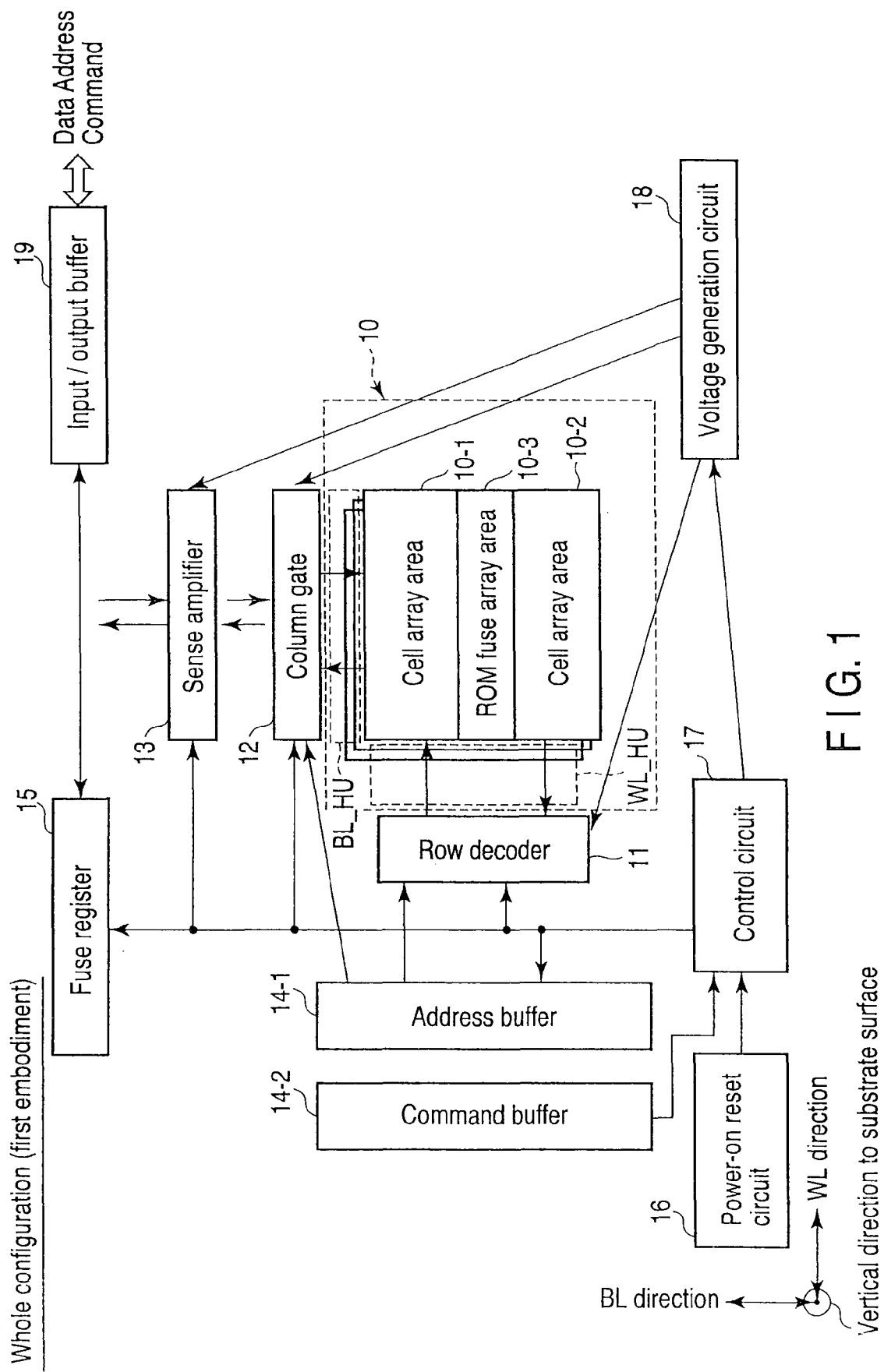
FIG. 1 is a block diagram showing an example of the whole configuration of a semiconductor memory device according to a first embodiment of this invention.

As shown in FIG. 1, the semiconductor memory device of this example comprises a memory cell array 10, row decoder 11, column gate 12, sense amplifier 13, address buffer 14-1, command buffer 14-2, fuse register 15, power-on reset circuit 16, control circuit 17, voltage generation circuit 18, input/output buffer 19, word line hook-up area WL_HU and bit line hook-up area BL_HU.

The memory cell array 10 comprises cell array areas 10-1, 10-2 each having a plurality of cross-point memory cells arranged in intersecting positions between plural bit lines and word lines in a matrix form and a ROM Fuse array area 10-3. The memory cell array 10 has a 3-dimensional structure with plural memory cell arrays laminated in a vertical direction with respect to the substrate surface of the semiconductor substrate.

The row decoder 11 decodes an address of a row direction (WL line direction). The row decoder 11 comprises a drive circuit that drives word lines.

The column gate 12 decodes an address of a column direction (BL line direction). The column gate 12 comprises a drive circuit that drives bit lines. In this example, the column gate 12 may have two portions arranged on the upper and lower sides of the memory cell array 10 although not shown in the drawing.

The sense amplifier 13 is electrically connected to the column gate 12 and bit lines to read data of a memory cell. Likewise, in this example, the sense amplifier 13 may have two portions arranged on the upper and lower sides of the memory cell array 10 although not shown in the drawing.

The address buffer 14-1 is electrically connected to the row decoder 12 and column gate 12 to temporarily hold a row address and column address.

The command buffer 14-2 is electrically connected to the control circuit 17 to temporarily hold a control command.

The fuse register 15 is electrically connected to the input/output buffer 19 via a data line to hold necessary data such as management data, for example.

The power-on reset circuit 16 detects power-on of the present device and outputs a reset signal to the control circuit 17.

The voltage generation circuit 18 is electrically connected to the row decoder 11, column gate 12 and sense amplifier 13 to supply necessary voltages to the above circuits under the control of the control circuit 17.

The input/output buffer 19 is electrically connected to the sense amplifier 13 and fuse register 15 via a data bus line to temporarily hold data, address and command from the exterior of a host device or the like.

The control circuit 17 controls the above circuits. For example, the control circuit 17 controls the above circuits to perform data write, data read and data erase operations that will be described later.

The word line hook-up area (word line lead-out area) WL_HU is an area arranged between the row decoder 11 and the cell array areas 10-1, 10-2 and ROM Fuse array area 10-3. The detail thereof is explained later.

The bit line hook-up area (bit line lead-out area) BL_HU is an area arranged between the column gate 12 and the cell array area 10-1 and ROM Fuse array area 10-3. The detail thereof is explained later in a second embodiment.

1-2. Circuit Configuration of Cell Array:

Next, the circuit configuration of a cell array 22 of this example is explained with reference to FIG. 2. As shown in FIG. 2, the cell array 22 of this example comprises a plurality of cross-point memory cells MC arranged in intersecting positions between the plural bit lines BL and word lines WL in a matrix form.

Each of the memory cells MC is configured by a variable resistance element 33 and diode 34. One end of the current path of the variable resistance element is connected to a corresponding one of the bit lines BL and the other end of the current path thereof is connected to the cathode of the diode 34. The anode of the diode 34 is connected to a corresponding one of the word lines WL.

One end of each word line WL is connected to the row decoder 11 via a MOS transistor RSW acting as a selection switch. One end of each bit line BL is electrically connected to the column gate 12 via a MOS transistor CSW acting as a selection switch.

A selection signal R used to select one of the word lines (rows) is input to the gate of each MOS transistor RSW. A selection signal used to select one of the bit lines (columns) is input to the gate of each MOS transistor CSW.

1-3. Configuration Example of Memory Cell and Dummy Memory Cell:

Next, the configuration example of the memory cell MC and dummy memory cell according to this embodiment is explained with reference to FIG. 3. As shown in FIG. 3, the memory cell according to this embodiment has a structure in which a diode 34 and a storage layer (resistance variable layer) 33 acting as a variable resistance element are laminated between the bit line BL and the word line WL.

The dummy memory cell (DMC) that will be described later is arranged between a dummy bit line DBL and a dummy word line DWL and has a structure in which a storage layer (resistance variable layer) 33 acting as a variable resistance element is laminated on a diode 34 like the case of the memory cell MC.

Figure 4:
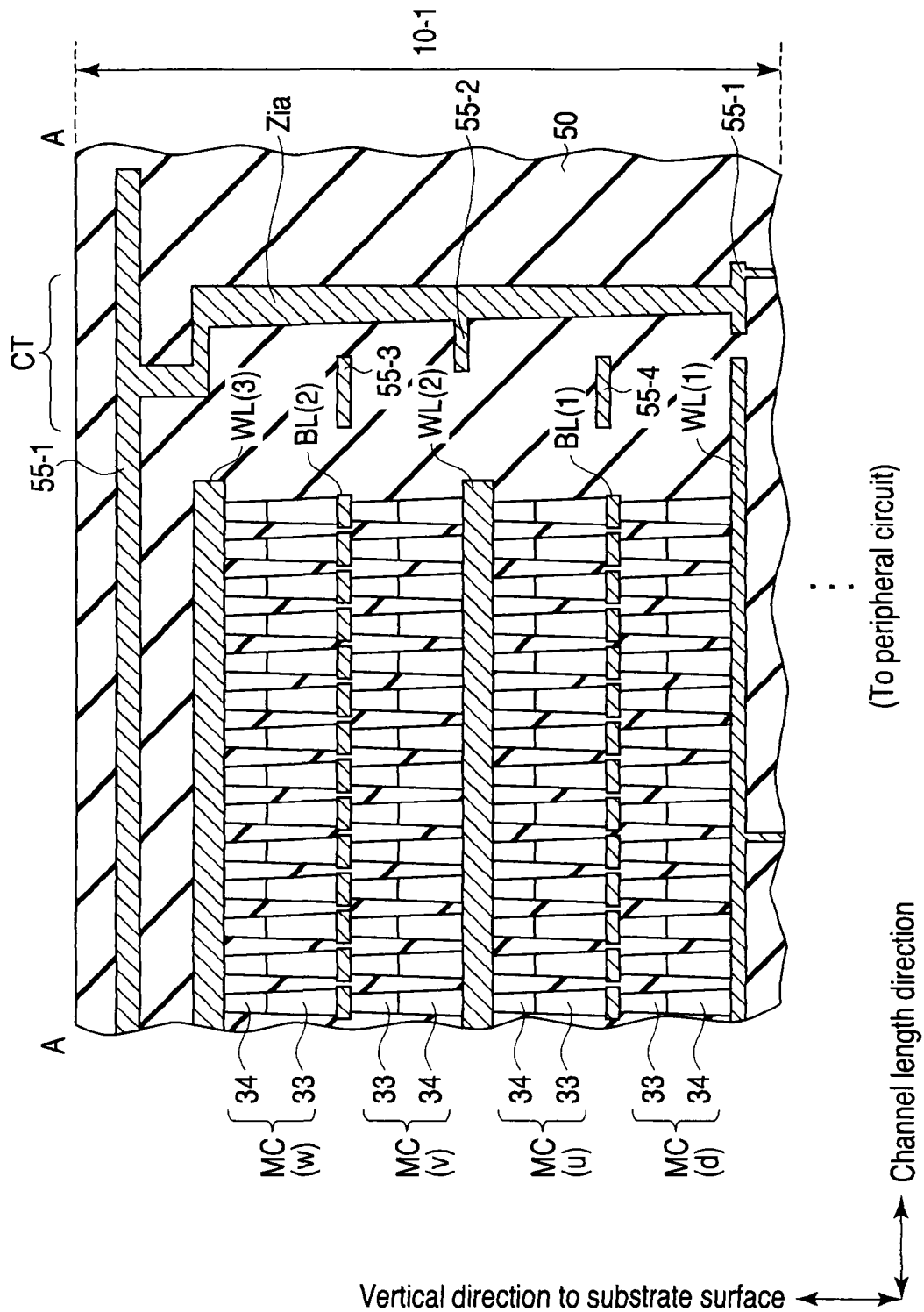
FIG. 4 is a view showing a 3-dimensional configuration example of the memory cell array according to the first embodiment.

1-4. 3-Dimensional Configuration Example of Memory Cell Array:

Next, the 3-dimensional configuration example of the memory cell array according to this embodiment is explained with reference to FIG. 4. As shown in FIG. 4, the memory cell array 10 of this example includes multi-layered layers containing the memory cells MC and formed in a 3-dimensional form on the semiconductor substrate.

The memory cell array 10 comprises a plurality of memory cells MC arranged in a 3-dimensional form on the upper-layer side of a peripheral circuit (not shown) containing sense amplifiers and the like in a vertical direction with respect to the substrate surface. The plural memory cells MC are arranged in intersecting positions between the word lines and bit lines in a matrix form, and in this example, layers containing four-layered memory cells MC are laminated in a 3-dimensional form. For example, memory cells MC(d) are arranged in intersecting positions between the word line WL(1) and the bit lines BL(1), memory cells MC(u) are arranged in intersecting positions between the word line WL(2) and the bit lines BL(1), memory cells MC(v) are arranged in intersecting positions between the word line WL(2) and the bit lines BL(2), and memory cells MC(w) are arranged in intersecting positions between the word line WL(3) and the bit lines BL(2). That is, the word lines WL and bit lines BL are alternately laminated and the memory cells MC are laminated in a vertical direction with respect to the substrate surface to arrange the memory cells MC in a 3-dimensional form.

As described above, each memory cell MC is a laminated structure of the recording layer (resistance variation layer) 33 and diode 34. The memory cells MC(d), MC(u) are arranged on the upper and lower sides of the common bit line BL(1) and each include the recording layer 33 and diode 34. Likewise, the memory cells MC(v), MC(w) are arranged on the upper and lower sides of the common bit line BL(2) and each include the recording layer 33 and diode 34.

Interconnection layers 55-1 to 55-4 are arranged in an inter-level insulating film 50 to electrically connect the memory cell array 10 with the peripheral circuit 25 and the like. An area in which the interconnection layers 55-1 to 55-4 are formed is called a contact ground area CT.

The four-layered layer of this embodiment is explained as an example, but this invention is not limited to this case. For example, a multi-layered layer such as an eight-layered layer or 16-layered layer may be used.

1-5. Configuration Example of Cell Array End and Hook-up Area (Lead-out Area):

Next, the configuration example of the cell array end and hook-up area according to this embodiment is explained with reference to FIGS. 5 and 6.

Figure 5:
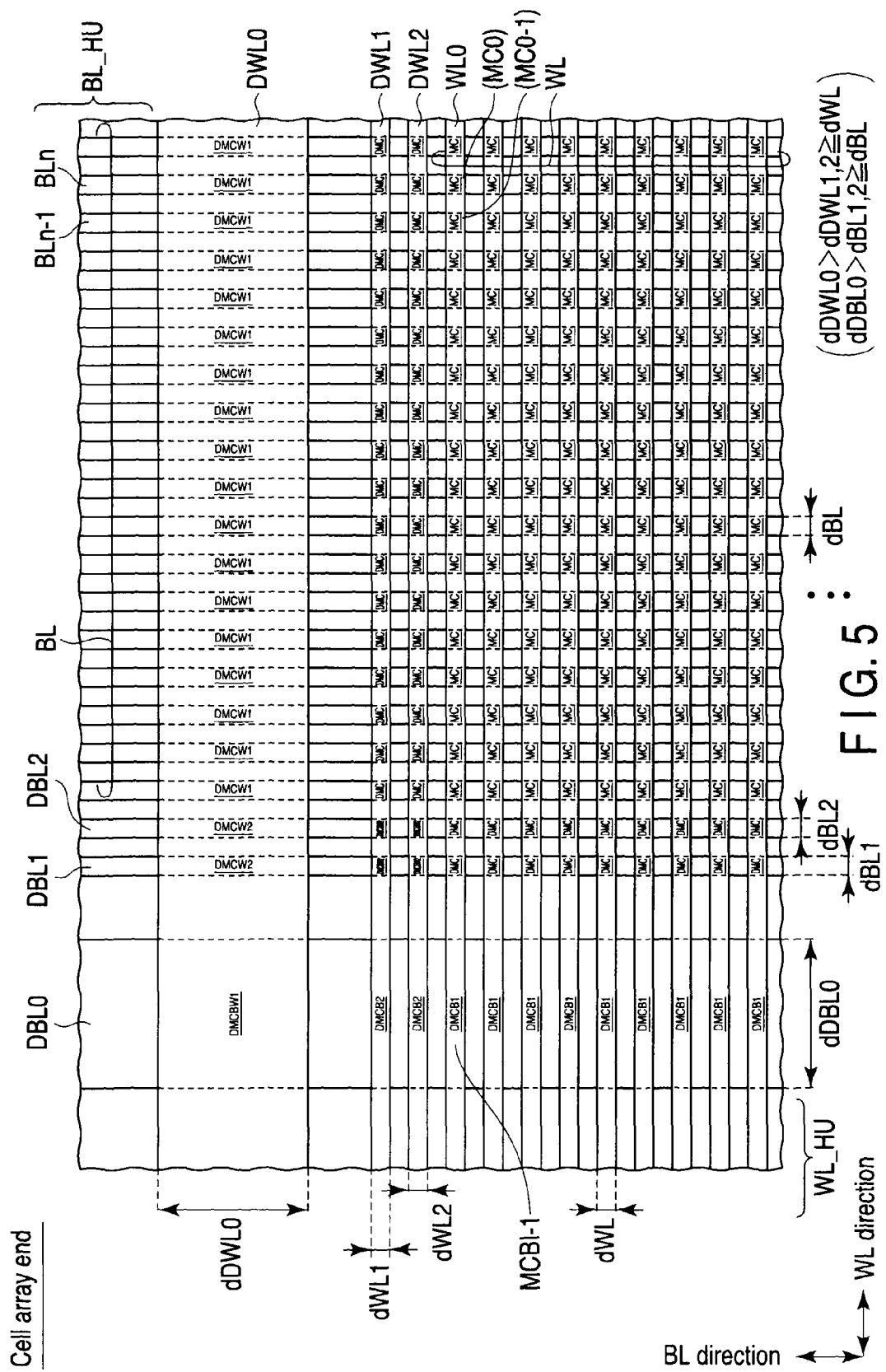
FIG. 5 is a plan view showing a boundary portion formed in contact with a word line hook-up area that is adjacent to the memory cell array according to the first embodiment.

The enlarged view of an end portion of the cell array is shown as a cell array end in FIG. 5. The bit line hook-up BL_HU is arranged at the cell array end in a direction in which the bit line extends (BL direction) and the word line hook-up WL_HU is arranged in a direction in which the word line extends (WL direction). A case wherein the word lines and bit lines in the end portion of the cell array include three dummy word lines (DWL0 to DWL2) and dummy bit lines (DBL0 to DBL2) from the outermost portion is taken as an example, but this invention is not limited to this case.

The word lines (upper interconnections) WL are arranged along the word line direction.

The outermost dummy word line (dummy first upper interconnection) DWL0 is arranged along the word line direction and the line width thereof is larger than that of the word line WL (line width: dDWL0>dWL).

The line widths of the dummy word lines (dummy second, third upper interconnections) DWL1, DWL2 adjacent to the dummy word line DWL0 are set at least equal to or larger than that of the word line WL (line width: dDWL1, dDWL2≧dWL).

The bit lines (lower interconnections) BL are arranged along the bit line direction.

The outermost dummy bit line (dummy first lower interconnection) DBL0 is arranged along the bit line direction and the line width thereof is larger than that of the bit line BL (line width: dBL0>dBL).

The line widths of the dummy bit lines (dummy second, third lower interconnections) DBL1, DBL2 adjacent to the dummy bit line DBL0 are set at least equal to or larger than that of the bit line BL (line width: dDBL1, dDBL2≧dBL).

The reason why the dummy word lines DWL0 to DWL2 and dummy bit lines DBL0 to DBL2 are disposed is that the difference in layout density in the cell array boundary portion becomes large. Then interconnection shape abnormality such as pattern elimination will occur if the word lines WL and bit lines BL whose interconnection widths are small are formed on the cell array end portion. Therefore, an attempt is made to prevent occurrence of interconnection shape abnormality such as pattern elimination by disposing interconnection patterns that are thicker than the word lines WL and bit lines BL as dummy patterns. Further, it becomes possible to effectively prevent occurrence of interconnection shape abnormality such as pattern elimination by disposing the dummy interconnections at intervals and with interconnection widths that are gradually increased in proportion to the distance from the cell array end.

The memory cells MC are arranged in the intersecting positions between the word lines WL and the bit lines BL. Further, the memory cells MC are arranged in the intersecting positions between the bit lines BL and the dummy word lines (DWL0 to DWL2), the memory cells MC are arranged in the intersecting positions between the word lines WL and the dummy bit lines (DBL0 to DBL2) and the memory cells MC are arranged in the intersecting positions between the dummy word lines (DWL0 to DWL2) and the dummy bit lines (DBL0 to DBL2).

Therefore, the respective interconnections and the names of the cells are defined as follows as shown in FIG. 6. At this time, numerals attached to the tail portions of the reference symbols are omitted in some cases and the numerals are set to a given numeral of "1" or "2" in this case.

Dummy memory cells DMCW1 (first dummy memory cells) are arranged in intersecting positions between the dummy word line DWL0 and the bit lines BL.

Dummy memory cells DMCB1 (second dummy memory cells) are arranged in intersecting positions between the word lines WL and the dummy bit line DBL0.

A dummy memory cell DMCBW1 (fifth dummy memory cell) is arranged in an intersecting position between the dummy word line DWL0 and the dummy bit line DBL0.

Dummy memory cells DMCB2 (sixth dummy memory cells) are arranged in intersecting positions between the dummy word lines DWL1, DWL2 and the dummy bit line DBL0.

Dummy memory cells DMC (third dummy memory cells) are arranged in intersecting positions between the dummy word lines DWL1, DWL2 and the bit lines BL.

Dummy memory cells DMCW2 (seventh dummy memory cells) are arranged in intersecting positions between the dummy word line DWL0 and the dummy bit lines DBL1, DBL2.

Dummy memory cells DMCBW2 (eighth dummy memory cells) are arranged in intersecting positions between the dummy word lines DWL1, DWL2 and the dummy bit lines DBL1, DBL2.

Dummy memory cells DMC (fourth dummy memory cells) are arranged in intersecting positions between the word lines WL and the dummy bit lines DBL1, DBL2.

In this case, since the memory cells MC and dummy memory cells DMC, DMCB1, DMCB2, DMCW1, DMCW2, DMCBW1, DMCBW2 are arranged in the intersecting positions between the respective interconnections, the areas of the memory cells MC and dummy memory cells DMC, DMCB1, DMCB2, DMCW1, DMCW2, DMCBW1, DMCBW2 as viewed from above are almost equal to the areas of portions in which the interconnections intersect. With the above configuration, the dummy word lines (DWL0 to DWL2) and dummy bit lines (DBL0 to DBL2) whose line widths are large are arranged in the cell array end portion. Therefore, each of the areas of the dummy memory cells (DMCW1, DMCW2, DMCB1, DMCB2, DMCBW1, DMCBW2) arranged in the intersecting positions as viewed from above is larger than the area of the memory cell MC. "The area as viewed from above" can be said to be an area as viewed in a direction in which a current flows in the memory cell MC.

1-6. Relation Between Cell Size and Application Voltage, Diode Characteristic:

Next, the relation between the cell size of the semiconductor memory device according to this embodiment and the application voltage and the diode characteristic are explained with reference to FIGS. 7 and 8. In this case, forming voltage Vform [V] in FIG. 7 is a voltage initially and uniformly applied to the memory cells MC and dummy memory cells DMC, for example, at the function test time or the like before shipment of the semiconductor memory device.

Figure 7:
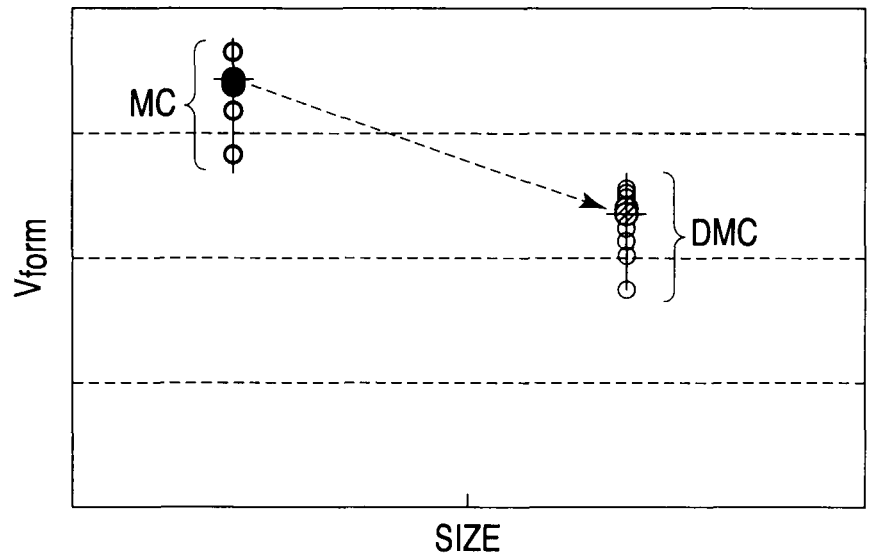
FIG. 7 is a diagram showing the relation between the cell size of the semiconductor memory device according to the first embodiment and the application voltage.

As shown in FIG. 7, it is understood that the forming voltage Vform becomes lower as (varies in inverse proportion to) the size (SIZE) of a cell that indicates an area thereof becomes larger.

As described above, the dummy word line DWL and dummy bit line DBL with large line width are arranged on the outermost portions of the cell array. Therefore, each of the areas of the dummy memory cells (DMCW, DMCB, DMCBW) arranged in the intersecting positions becomes larger than the area of the memory cell MC. For example, the area of the dummy memory cell (DMCW, DMCB, DMCBW) is set to approximately 15 times the area of the memory cell MC.

If the same voltage is uniformly applied to the memory cell MC and dummy memory cell DMC having the above relation, an excessively high voltage is applied to the dummy memory cell DMC and a large current flows therein in forming. For example, it is supposed that a memory cell MC formed in the intersecting position between the word line WL0 adjacent to the dummy word line DWL2 and the bit line BLn is set to a memory cell MC0, a memory cell MC formed in the intersecting position between the word line WL0 and the bit line BLn+1 adjacent to the bit line BLn is set to a memory cell MC0-1, and a dummy memory cell DMCB1 formed in the intersecting position between the dummy bit line DBL0 and the word line WL0 is set to a dummy memory cell DMCB1-1. In this case, it is considered that the potential of the dummy bit line WBL0 is set to the same potential as that of the bit line BLn+1 (adjacent to the bit line BLn) that is set in a read inhibition state at the time of forming a memory cell MC0. Then, the voltage applied to the memory cell MC-1 is set equal to the voltage applied to the dummy memory cell DMCB1-1.

However, the area of the dummy memory cell DMCB1-1 as viewed from above is larger than the area of the memory cell MC0-1. As a result, a current flowing in the dummy memory cell DMCB1-1 becomes larger than a current flowing in the memory cell MC0-1.

Therefore, the characteristic of the dummy memory cell DMCB1-1 that does not originally function as a memory cell MC may be varied and the dummy memory DMCB1-1 cell may function as a conductor in some cases. Further, an increase in the leak current flowing in the dummy memory cell DMCB1-1 indicates that a current flowing from the word line WL0 to the dummy bit line DBL0 increases. As a result, the potential of the word line WL0 is lowered and there occurs a possibility that it becomes impossible to form a memory cell MC0.

Further, a case of the read operation is considered. For example, it is considered that the potential of the dummy bit line DBL0 is set to the same potential as that of the bit line BLn+1 that is set in a read inhibition state when data of the memory cell MC0 is read. Then, the voltage applied to the memory cell MC0-1 is set equal to the voltage applied to the dummy memory cell DMCB1-1.

However, the area of the dummy memory cell DMCB1-1 as viewed from above is larger than the area of the memory cell MC0-1. As a result, a current flowing in the dummy memory cell DMCB1-1 becomes larger than a current flowing in the memory cell MC0-1.

That is, an increase in the current flowing in the dummy memory cell DMCB1-1 indicates that a leak current flowing from the word line WL0 to the dummy bit line WBL0 increases. As a result, the power consumption becomes larger. Further, the potential of the word line WL0 is lowered and there occurs a possibility that it becomes impossible to correctly read data from the memory cell MC0.

Figure 8:
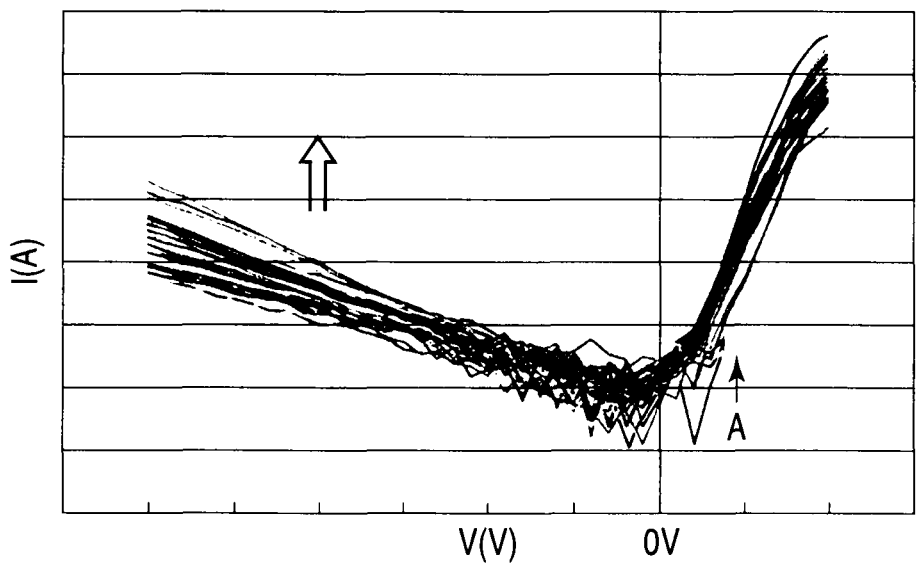
FIG. 8 is a diagram showing the IV characteristic of a diode in the semiconductor memory device according to the first embodiment.

FIG. 8 shows the current-voltage characteristic of the diode 34 of the memory cell MC. For example, as shown in FIG. 8, a case wherein a reverse bias voltage is applied to the dummy memory cell DMCW1 or DMCB1 (a case wherein the voltage on the abscissa is negative in FIG. 8) is considered. At this time, if the line width of the dummy word line DWL0 or dummy bit line DBL0 is increased to 10 times (the area is increased to 10 times) that of the word line WL or bit line BL, respectively, a reverse bias current is increased by approximately 10 times. As a result, the power consumption (leak current) increases in proportion to the number of dummy memory cells DMCW1, DMCB1 that exist in the cell array. At this time, since a wasteful current flows, it is predicted that the probability of occurrence of faulty bits or faults is increased.

Further, the operation range of the memory cell MC selected in read operation is limited due to a voltage drop of the interconnection. That is, the potential applied to the selected memory cell MC rises only up to a point A in FIG. 8, for example, and only a small current near a rising portion of the forward current of the diode is obtained as the read current. As a result, the read margin of the memory cell MC is narrowed and read faults will frequently occur.

Thus, if the same voltage is uniformly applied to the memory cell MC and dummy memory cell DMC, the operation becomes unstable.

Therefore, the inventors of this application and others have invented a semiconductor memory device that is advantageous in stabilizing the operation by making constant a current (current ratio) for each unit area of the memory cell MC and dummy memory cell DMC. In the following description, a control operation for making constant a current (current ratio) for each unit area of the memory cell MC and dummy memory cell DMC is explained.

2. Voltage Relation of Word Line, Bit Line, Dummy Word Line and Dummy Bit Line Next, the voltage relation between the dummy word line DWL and dummy bit line DBL in this example is explained with reference to FIGS. 9 to 12. In this case, the dummy word lines (DWL0 to DWL2) and dummy bit lines (DBL0 to DBL2) are always set in the unselected state.

Figure 9:
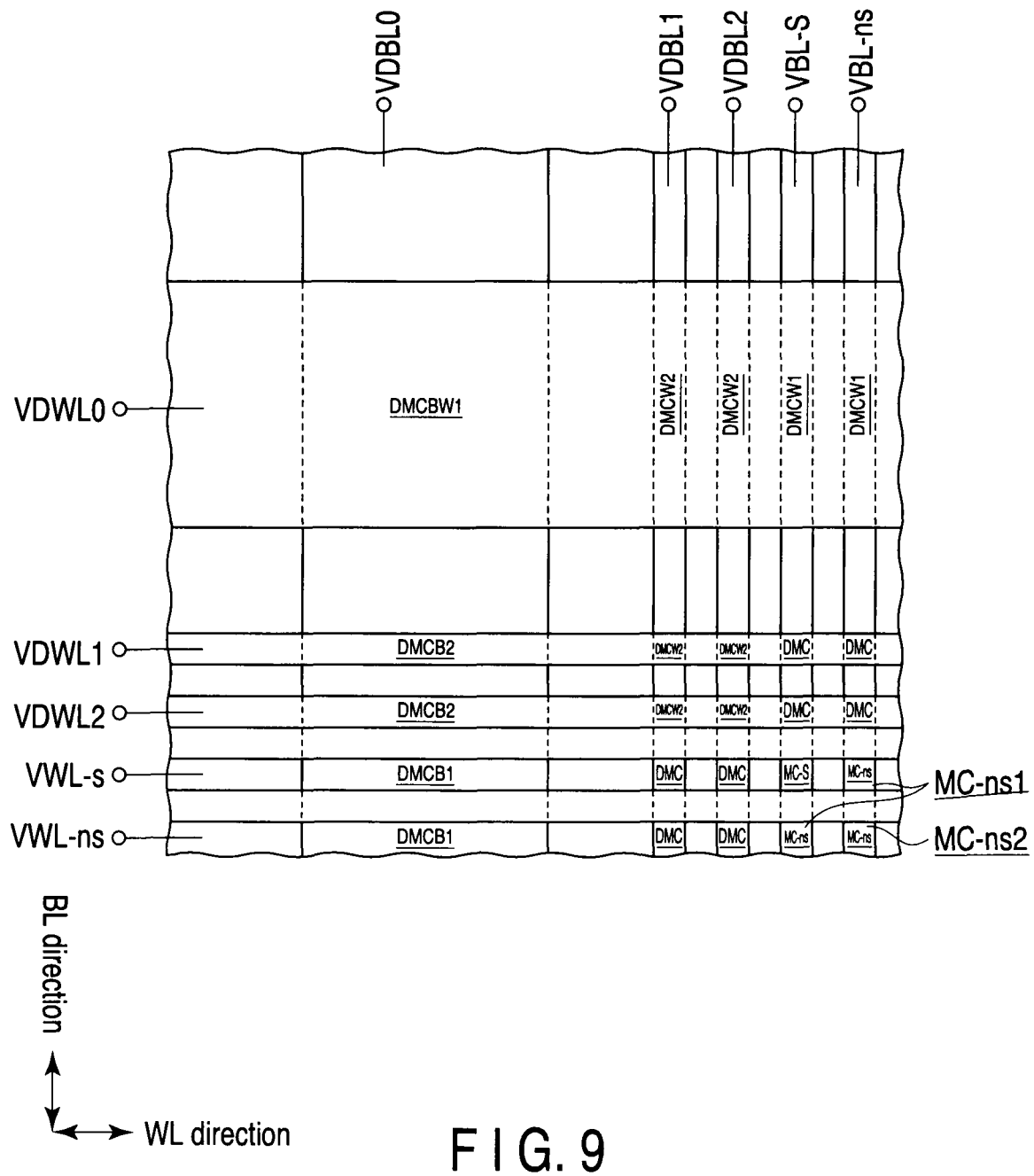
FIG. 9 is a plan view showing the voltage relation in the word line hook-up area according to the first embodiment.

As shown in FIG. 9, the control circuit 17 independently controls voltages applied to the selected/unselected word lines, plural dummy word lines (DWL0, DWL1), selected/unselected bit lines and dummy bit lines (DBL0, DBL1) to different values in order to make constant the ratio of currents flowing in the unselected memory cell and dummy memory cell. At this time, it is supposed that an n-type layer of the diode 34 of the memory cell MC is disposed on the word line WL side and a p-type layer is disposed on the bit line BL side. In a selected memory cell MC-s, a voltage on the bit line BL side is set higher than a voltage on the word line WL side. Further, in an unselected memory cell MC-ns, a voltage on the bit line BL side is set lower than a voltage on the word line WL side or a voltage on the bit line BL side is set equal to a voltage on the word line WL side. More specifically, As shown in FIG. 10, the control circuit 17 controls a voltage applied to the dummy word line DWL0 to be set between voltages applied to selected and unselected word lines WL (VWL-s, (first voltage)<VDWL0 (third voltage) <VWL-ns (second voltage)). Further, if the width of the dummy word lines DWL1, DWL2 is larger than or equal to the width of the word line WL, the control circuit 17 controls voltages applied to the dummy word lines DWL1, DWL2 to become lower than or equal to the voltage applied to the unselected word line WL (VDWL1, VDWL2 (seventh voltage)≦VWL-ns (second voltage)). If the interconnection widths of the dummy word lines DWL1, DWL2 and the unselected word line WL are equal, the relation of VDWL1, VDWL2 (seventh voltage)=VWL-ns (second voltage) is obtained.

As shown in FIG. 11, the control circuit 17 controls a voltage applied to the dummy bit line DBL0 to be set between voltages applied to selected and unselected bit lines BL (VBL-s (fourth voltage)>VDBL0 (sixth voltage)>VBL-ns (fifth voltage)). Further, if the width of the dummy bit lines DBL1, DBL2 is larger than or equal to the width of the bit line BL, the control circuit 17 controls voltages applied to the dummy bit lines DBL1, DBL2 to become not lower than a voltage applied to the unselected bit line BL (VBL-ns (fifth voltage)≦VDBL1, VDBL2 (eighth voltage)). If the interconnection widths of the dummy bit lines DBL1, DBL2 and the unselected bit line BL are equal, the relation of VDBL1, VDBL2 (eighth voltage)=VBL-ns (fifth voltage) is obtained.

Thus, in this example, the control circuit 17 controls voltages applied to the respective interconnections to change currents in inverse proportion to the cell area and make constant the ratio of currents flowing in the memory cell MC and dummy memory cell based on the relation of the area dependency of the electrical characteristics of the cells shown in FIGS. 7 and 8. That is, the voltages applied to the dummy memory cells DMCW1 and DMCB1 are set lower than the voltages applied to the selected memory cell MC-s and unselected memory cell MC-ns. Further, if the widths of the dummy word lines DWL1, DWL2 are larger than the width of the word line WL, the voltage applied to the dummy memory cell DMC is set lower than the voltages applied to the selected memory cell MC-s and unselected memory cell MC-ns. If the widths of the dummy bit lines DBL1, DBL2 are larger than the width of the bit line BL, the voltage applied to the dummy memory cell DMC is set lower than the voltages applied to the selected memory cell MC-s and unselected memory cell MC-ns.

The area of the dummy memory cell DMCB disposed in the intersecting position between the dummy word line DWL0 and the dummy bit line DBL0 as viewed from above becomes the largest area. However, the dummy memory cells DMCB are formed only four for respective layers of one cell array. The dummy memory cells DMCW1 and DMCB1 of (the number of bit lines BL+the number of word lines WL)×2 are disposed for each cell array. In this case, if the total area of the dummy memory cells DMCBW and that of the dummy memory cells DMCW1 and DMCB1 are compared, the total area of the dummy memory cells DMCW1 and DMCB1 becomes larger.

Therefore, it is preferable for the control circuit 17 to control and make constant the ratio of currents flowing in the memory cell MC and the dummy memory cells DMCW1 and DMCB1.

Further, the control circuit 17 can set a leak current flowing in the dummy memory cell DMCBW1 to minimum if VDWL0 and VDBL0 can be set equal to each other and thus it can stabilize the operation of the semiconductor memory device.

Figure 12:
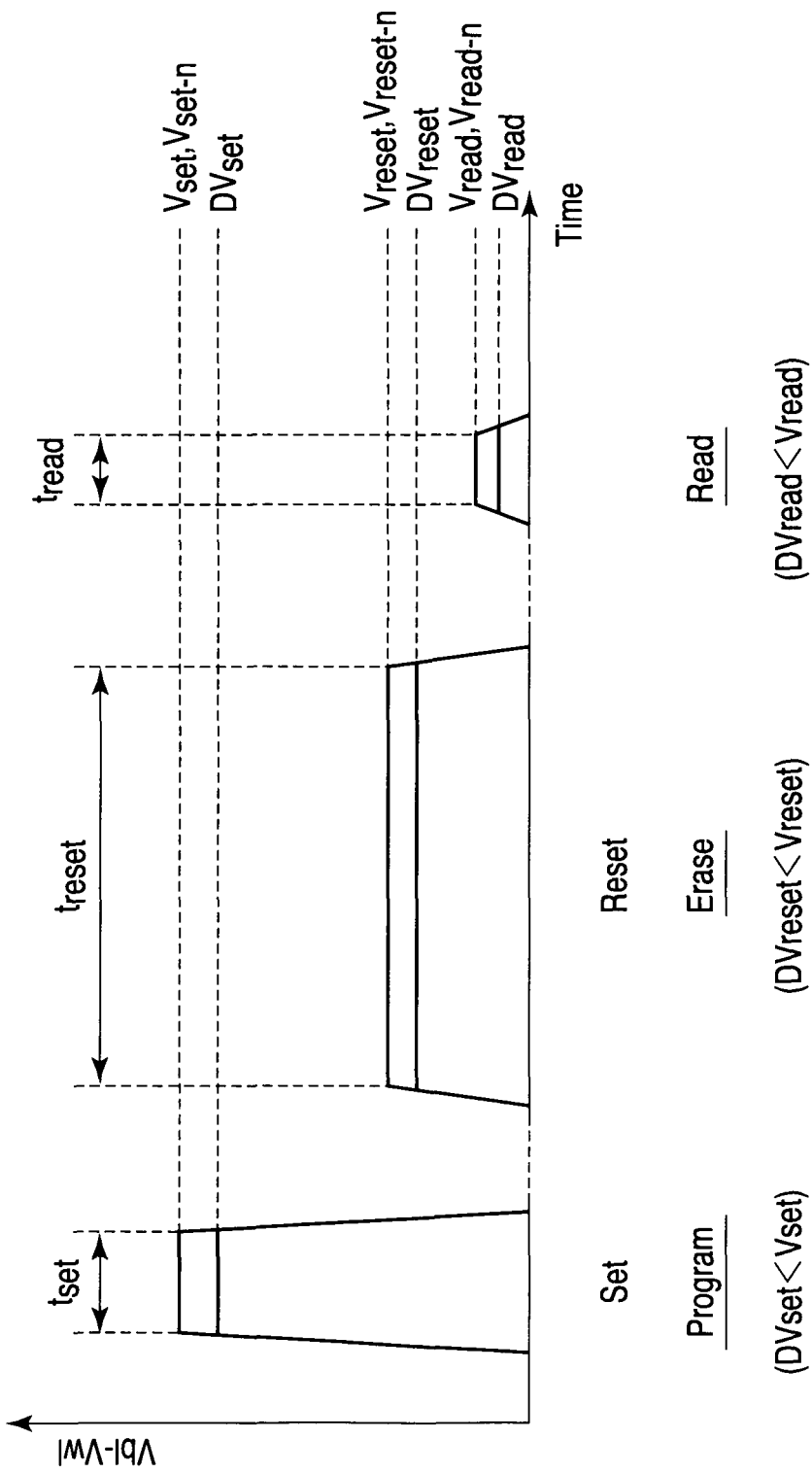
FIG. 12 is a diagram showing the voltage relation of various operations of the semiconductor memory device according to the first embodiment.

As a result, the control circuit can more specifically control the respective operations as shown in FIG. 12.

2-1. Data Program Operation (Information Recording/Setting Operation):

First, the function of the memory cell MC and the dummy memory cells (DMCW1, DMCW2, DMCB1, DMCB2, DMCBW1, DMCBW2, DMC) in the data program operation is explained. In this case, it is supposed that a selected memory cell is set to MC-s and an unselected memory cell is set to MC-ns.

In the case of the memory cell MC, in order to program data, a voltage may be applied to the variable resistance element 33 configuring the storage layer of the selected memory cell MC during time $t_{set}$ to cause potential gradient $V_{set}$ in the selected variable resistance element 33 and pass a current. For example, in order to program data in the selected memory cell MC-s, a state in which the potential of the selected word line WL is set relatively lower than the potential of the selected bit line BL is set. If the potential of the bit line BL is a fixed potential (for example, approximately several V), a ground potential may be applied to the word line WL. At the data write operation tome, the potential relation is set to apply a reverse bias voltage to the diode 34 of an unselected memory cell MC-ns2 formed in the intersecting position between the unselected word line WL and the unselected bit line BL. For example, a ground potential is applied to the unselected bit line BL and a fixed potential (for example, approximately several V) is applied to the unselected word line WL. At this time, potential gradient Vset-ns occurs in the unselected memory cell MC-ns2.

Potentials applied to unselected memory cells MC-ns1 disposed in the intersecting position between the selected word line WL and the unselected bit line BL and in the intersecting position between the unselected word line WL and the selected bit line BL can set potential gradient occurring in the unselected memory cells MC-ns1 to "0" if a potential applied to the unselected word line WL is set equal to a potential applied to the selected bit line BL and a potential applied to the selected word line WL is set equal to a potential applied to the unselected bit line BL.

It is preferable to precharge all of the word lines WL and all of the bit lines BL at the standby time before the data program operation. Further, application voltages for program data may be generated by setting a state in which the potential of the word line WL is set relatively higher than the potential of the bit line BL.

In the case of the dummy memory cells (DMCW, DMCB, DMCBW), the dummy word lines (DWL0 to DWL2) and dummy bit lines (DBL0 to DBL2) are controlled to set potential gradient $DV_{set}$ applied to the dummy memory cell smaller than potential gradient $V_{set-n}$ applied to the unselected memory cell MC-ns2 ($DV_{set}<V_{set}t$).

2-2. Data Read Operation (Information Reproduction Operation):

In the case of the memory cell MC, for example, the data read operation is performed by applying a voltage pulse to a selected variable resistance element 33 during time $t_{read}$ and detecting a current determined by the resistance of the selected memory cell MC. It is preferable to set the voltage pulse to have minute amplitude that does not cause a material configuring the variable resistance element 33 to change the state. For example, the data read operation is performed by applying a read voltage from the bit line BL to the selected memory cell MC and measuring a current value at this time by means of the sense amplifier 13.

In the case of the dummy memory cells (DMCW, DMCB, DMCBW), the dummy word lines (DWL0 to DWL2) and dummy bit lines (DBL0 to DBL2) are controlled to set potential gradient $DV_{read}$ applied to the dummy memory cell smaller than potential gradient $V_{read-n}$ applied to the unselected memory cell MC-ns2 (DVread<Vread).

2-3. Data Erase Operation (Reset Operation):

In the case of the memory cell MC, the data erase operation is performed by heating a selected variable resistance element 33 by use of Joule heat generated by a large current pulse during time $t_{reset}$ and promoting an oxidation-reduction reaction in the variable resistance element 33.

In the case of the dummy memory cells (DMCW, DMCB, DMCBW), the dummy word lines (DWL0 to DWL2) and dummy bit lines (DBL0 to DBL2) are controlled to set potential gradient $DV_{reset}$ applied to the dummy memory cell smaller than potential gradient $V_{reset-n}$ applied to the unselected memory cell MC-ns2 (DVreset<Vreset).

3. Operation And Effect

According to the semiconductor memory device of this embodiment, at least the following effect (1) can be attained.

(1) It is advantageous in stabilizing the operation.

As shown in FIG. 10, the control circuit 17 applies voltage VWL-s (first voltage) to the selected word line WL, applies voltage VWL-sn (second voltage) to the unselected word line WL, applies voltage VDWL0 (third voltage) to the dummy word line DWL0 and independently controls the first to third voltages to different values. More specifically, the control circuit 17 controls the third voltage applied to the dummy word line DWL0 to be set between the first and second voltages applied to the selected and unselected word lines WL (VWL-s (first voltage)<VDWL0 (third voltage)<VWL-ns (second voltage).

Therefore, a current flowing in the unselected memory cell MC and a current flowing in the first dummy memory cell DMCW can be made uniform and the current ratio can be made constant.

As shown in FIG. 11, the control circuit 17 applies voltage VBL-s (fourth voltage) to the selected bit line BL, applies voltage VBL-sn (fifth voltage) to the unselected bit line BL, applies voltage VDBL0 (sixth voltage) to the dummy bit line DBL0 and controls the fourth to sixth voltages to different values. More specifically, the control circuit 17 controls the sixth voltage applied to the dummy bit line DBL0 to be set between the fourth and fifth voltages applied to the selected and unselected bit lines BL (VBL-s (fourth voltage)>VDBL0 (sixth voltage)>VBL-ns (fifth voltage).

Therefore, a current flowing in the unselected memory cell MC and a current flowing in the first dummy memory cell DMCW can be made uniform and the current ratio can be made constant.

As a result, for example, as shown in FIG. 12, the control operation can be performed to make uniform a current flowing in the unselected memory cell MC and a current flowing in the first dummy memory cell DMCW and make the current ratio constant at the time of respective operations such as the data program operation.

As described above, according to the configuration and operation of this example, a bias voltage is not collectively applied to the central portion and peripheral portion of the memory cell array 10 and voltages are independently applied according to the area of the cells. Therefore, since the current ratio of the cells in the central portion and peripheral portion of the memory cell array 10 can be made uniform, it is advantageous in stabilizing the operation.

(2) Reliability can be enhanced.

As described in the item (1), in this example, the current ratio of the cells in the central portion and peripheral portion of the memory cell array 10 can be made uniform. As a result, it is advantageous in improving the reliability because the application voltages can be independently controlled irrespective of the electrical characteristics of the storage layer 33 and diode 34 of the dummy word lines (DWL0 to DWL2) and dummy bit lines (DBL0 to DBL2) according to the line widths finished processing.

For example, when the upper and lower interconnections (WL, BL, DWL, DBL) are simultaneously processed, the sizes of to-be-formed memory cells MC and dummy memory cells DMC are determined by the sizes of the above interconnections. Because the storage layer 33 and diode 34 are disposed between the upper and lower interconnections (WL, BL, DWL, DBL). In case the interconnections (DWL0, DBL0) with the large line width are arranged in the cell array end portion of this example, the area of the dummy memory cell formed therebetween becomes large as viewed from above. Therefore, the same operation cannot be expected even if the same voltage as that applied to the other cells is applied.

Second Embodiment

One Example of Bit Line Hook-Up Area (Bit Line Lead-Out Area)

Figure 15:
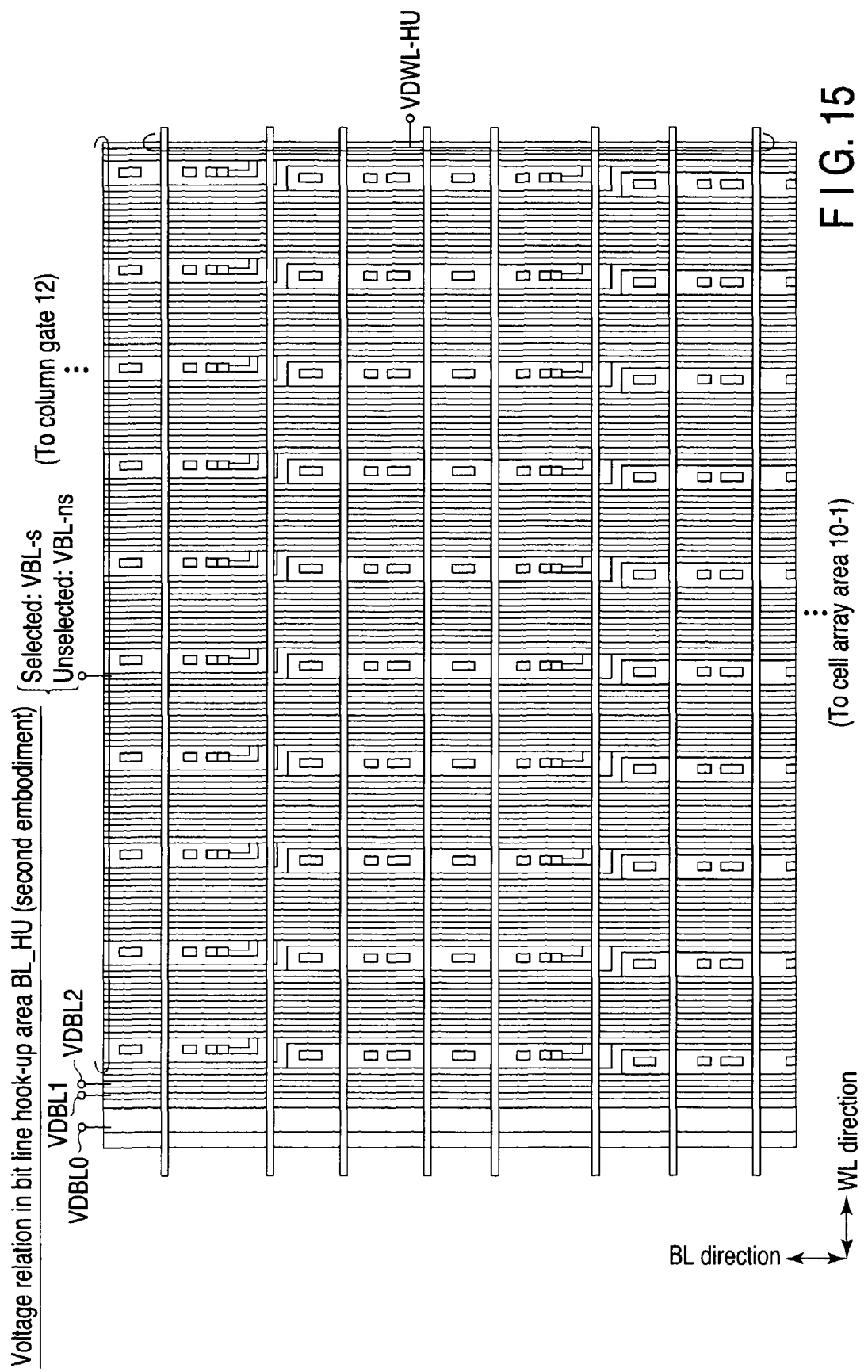
FIG. 15 is a plan view showing the voltage relation in the bit line hook-up area according to the second embodiment.

Next, a semiconductor memory device of a second embodiment is explained with reference to FIGS. 13 to 15. This embodiment relates to one example of a bit line hook-up area (bit line lead-out area) BL_HU. In the explanation, the detailed explanation for portions that are the same as those of the first embodiment is omitted.

Configuration Example

Background

Figure 13:
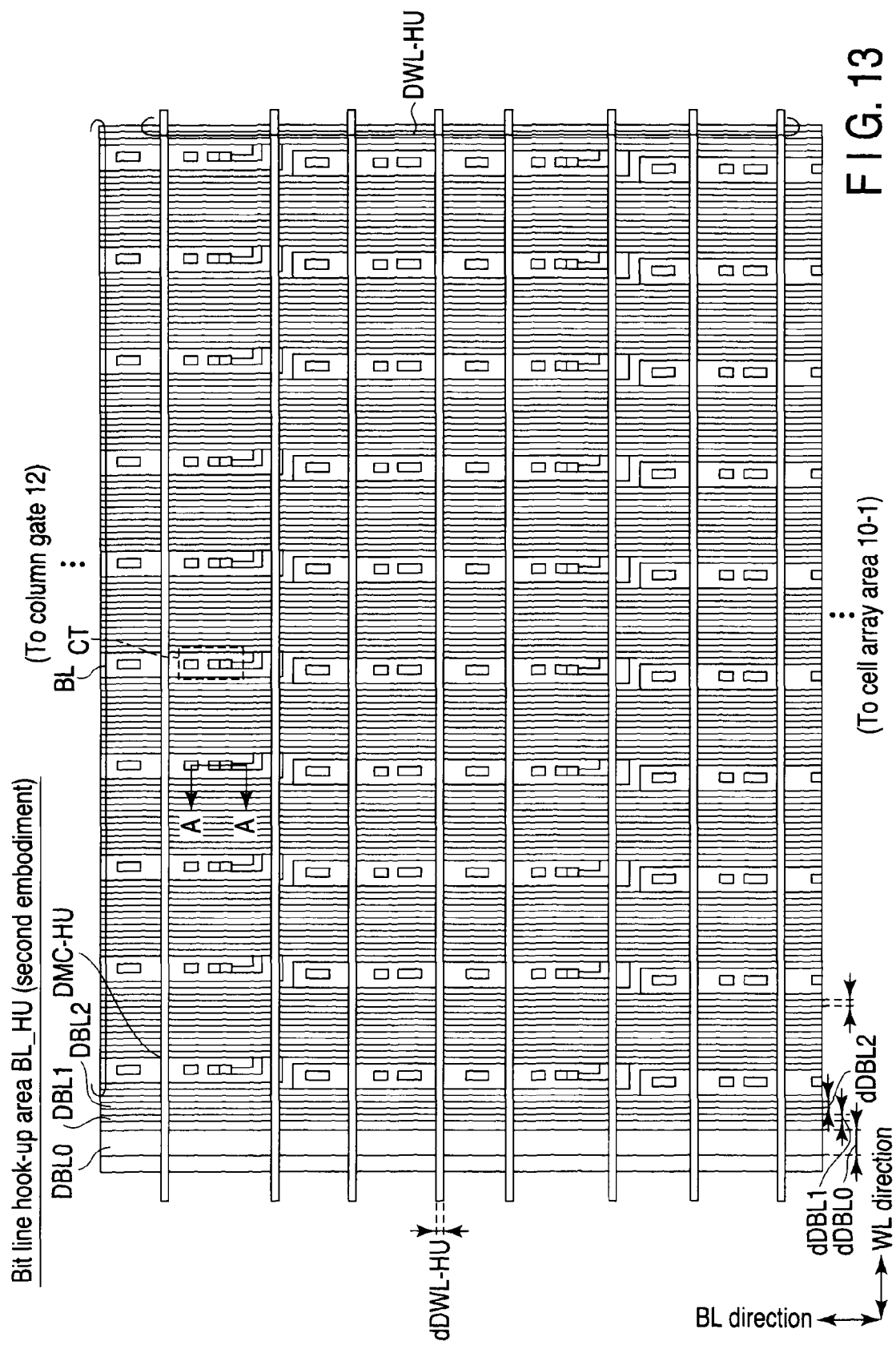
FIG. 13 is a plan view showing a bit line hook-up area of a semiconductor memory device according to a second embodiment of this invention.

As shown in FIG. 13, dummy word liens (DWL-HU), bit lines BL, dummy bit lines (DBL0 to DBL2) are arranged and dummy memory cells are similarly arranged in the intersecting positions therebetween even in the bit line hook-up area BL_HU. In this example, currents flowing in the dummy memory cells arranged in the bit line hook-up area BL_HU can be made uniform and the ratio of the currents can be set to the current ratio of the memory cells MC.

For example, a manufacturing method for processing and forming storage layers 33 and diodes 34 at the same time as the processing time of upper and lower interconnections (WL, BL, DWL, DBL) as described in Jpn. Pat. Appln. KOKAI Publication No. 2009-130140 is known. In this case, the sizes of the memory cells MC and dummy memory cells DMC to be formed are determined based on the sizes of the above interconnections.

The area of the bit line hook-up area BL_HU is large and dishing occurs in case an inter-level insulating layer 50 that fills gaps between memory cells MC(u). If a dummy word line DWL is not disposed between the bit line BL(1) and the bit line BL(2) shown in FIG. 4, the shape of the bit line BL(2) formed above the inter-level insulating film 50 will become abnormal.

Therefore, it becomes preferable to arrange a dummy word line DWL-HU in the bit line hook-up area BL_HU, but there occurs a problem in case the present manufacturing method is applied to formation of a word line hook-up area WL_HU of this example.

It is preferable to set the line width of the dummy word line (DWL-HU) in the bit line hook-up area BL_HU larger than the width of the word line WL in the cell array. Because the bit line hook-up area BL_HU is arranged outside the cell array and the pattern is a coarse area. As a result, a dummy memory cell DMC-HU in which the area as viewed from above is larger than that of the memory cell MC will be disposed in the intersecting position between the dummy word line (DWL-HU) in the bit line hook-up area BL_HU and the bit line BL.

Example of Plane Structure

As shown in FIG. 13, the dummy word lines DWL-HU are disposed to extend in the word line direction and arranged at preset intervals in the bit line direction. The line width of the dummy word line DWLHU is larger than the line width of the word line (line width: dDWL-HU>dWL). A plurality of contact ground areas CT are formed between the dummy word lines DWL-HU in the BL direction.

The bit lines (lower interconnections) BL are arranged in the bit line direction.

The outermost dummy bit line (dummy first lower interconnection) DBL0 is arranged in the bit line direction and the line width thereof is larger than that of the bit line BL (line width: dDBL0>dBL).

The line width of the dummy bit lines (dummy second, third lower interconnections) DBL1, DBL2 that are adjacent to the dummy bit line DBL0 is at least equal to or larger than the line width of the bit line BL (line width: dDBL1, dDBL2≧dBL).

Example of Cross-Sectional Structure

An example of the cross-sectional structure taken along the A-A line of the contact ground area CT of FIG. 13 is shown in FIG. 14.

As shown in FIG. 14, an interconnection layer M1 connected to a peripheral circuit, via layer V2, interconnection layer 55, via layer Zia and bit line BL are sequentially disposed in an inter-level insulating film 77. If the above manufacturing method is used, the upper surface of the inter-level insulating film 77 is divided for each upper surface of the bit line and word line WL and the inter-level insulating film 77 is divided into first to third inter-level insulating films 77-1 to 77-3. The interconnection layer 55 is formed in the same manufacturing step as that for formation of the word lines WL of the respective layers. In this case, although not shown in the drawing, the interconnection layer 55 is shifted and plural layers including the bit line are laminated.

Voltage Relation in Bit Line Hook-up Area

Next, the voltage relation in the bit line hook-up area BL_HU in this example is explained with reference to FIG. 15.

The control circuit 17 independently controls voltages applied to plural dummy word lines (DWL-HU), selected/unselected bit lines and dummy bit lines (DBL0, DBL1, DBL2) to be set to different values to make constant the ratio of currents flowing through the dummy memory cell DMC-HU and unselected memory cell MC-ns shown in FIG. 9. More specifically, the control circuit 17 controls a voltage (VDWL-HU) applied to the dummy word line DWL-HU to be set between voltages applied to selected and unselected word lines WL shown in FIG. 9 (VWL-s (first voltage) <VDWL-HU (third voltage)<VWL-ns (second voltage).

The control circuit 17 controls a voltage applied to the dummy bit line DBL0 to be set between voltages applied to selected and unselected bit lines BL (VBL-s (fourth voltage) >VDBL0 (sixth voltage)>VBL-ns (fifth voltage). Further, the control circuit 17 controls and sets voltages applied to the dummy bit lines DBL1, DWL2 higher than or equal to a voltage applied to the unselected bit line BL (VBL-ns (fifth voltage)≦VDBL1, VDBL2 (eighth voltage).

Thus, in this example, the control circuit 17 controls voltages applied to the respective interconnections to change currents in inverse proportion to the cell area and make constant the ratio of currents flowing in the memory cell MC and dummy memory cell DMC-HU based on the area dependency of the electrical characteristics of the cells shown in FIGS. 6 and 7.

As described above, according to the semiconductor memory device according to the embodiment, the same effect as at least the effects (1) and (2) can be attained. Further, as shown in this example, this invention can be similarly applied to the bit line hook-up area (bit line lead-out area) BL_HU as required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistive storage-based semiconductor memory device comprising:
    a plurality of upper interconnections;
    a plurality of lower interconnections;
    a first dummy upper interconnection with line width larger than that of the upper interconnection;
    memory cells arranged in intersecting positions between the upper interconnections and the lower interconnections;
    first dummy cells arranged in intersecting positions between the first dummy upper interconnection and the lower interconnections; and
    a control circuit that applies a first voltage to a selected one of the upper interconnections, applies a second voltage to an unselected one of the upper interconnections, applies a third voltage to the first dummy upper interconnection and independently controls the first to third voltages to be set to different values.

2. The device of claim 1, wherein the control circuit controls the third voltage to be set between the first and second voltages to make constant a ratio of currents flowing through the unselected memory cell and the first dummy cell.

3. The device of claim 1, further comprising a first dummy lower interconnection with line width larger than that of the lower interconnection; and second dummy cells arranged in intersecting positions between the first dummy lower interconnection and the upper interconnections,
    wherein the control circuit applies a fourth voltage to the selected lower interconnection, applies a fifth voltage to the unselected lower interconnection, applies a sixth voltage to the first dummy lower interconnection and independently controls the fourth to sixth voltages to be set to different values.

4. The device of claim 3, wherein the control circuit controls the sixth voltage to be set between the fourth and fifth voltages to make constant a ratio of currents flowing through the unselected memory cell and the second dummy cell.

5. The device of claim 4, wherein the control circuit controls the third voltage to be set between the first and second voltages to make constant a ratio of currents flowing through the unselected memory cell and the first dummy cell.

6. The device of claim 3, wherein the first and fifth voltages are ground potentials.

7. The device of claim 1, further comprising a second dummy upper interconnection with line width larger than that of the upper interconnection and first dummy upper interconnection; and third dummy cells arranged in intersecting positions between the second dummy upper interconnection and the lower interconnections,
wherein the control circuit applies a seventh voltage to the second dummy upper interconnection selected and controls the seventh voltage to be set not higher than the second voltage and higher than the third voltage.

8. The device of claim 3, further comprising a second dummy lower interconnection with line width larger than that of the lower interconnection and first dummy lower interconnection; and fourth dummy cells arranged in intersecting positions between the upper interconnections and the second dummy lower interconnection,
wherein the control circuit applies an eighth voltage to the second dummy lower interconnection selected and controls the eighth voltage to be set not lower than the fifth voltage and lower than the sixth voltage.

9. The device of claim 3, further comprising a fifth dummy cell arranged in an intersecting position between the first dummy upper interconnection and the first dummy lower interconnection, an area of the fifth dummy cell as viewed from above being larger than an area of the memory cell as viewed from above.

10. The device of claim 1, wherein the upper interconnections, lower interconnections and first dummy upper interconnection are arranged in one of a lead-out area of the upper interconnections or a lead-out area of the lower interconnections.

11. The device of claim 10, further comprising third dummy upper interconnections extend in a direction perpendicular to a direction in which the lower interconnections extend and disposed at preset intervals in the extending direction of the lower interconnections; and
sixth dummy cells are formed between the third dummy upper interconnections and the lower interconnections.

12. The device of claim 11, wherein width of the third dummy upper interconnection is larger than that of the lower interconnection.

13. The device of claim 1, further comprising a plurality of memory cell arrays having the memory cells arranged therein, the memory cell arrays being laminated in a direction perpendicular to a substrate surface of a semiconductor substrate into a 3-dimensional structure.

14. A resistive storage-based semiconductor memory device comprising:
a plurality of upper interconnections;
a plurality of lower interconnections;
a first dummy upper interconnection arranged in a same level as the upper interconnections and having line width larger than that of the upper interconnection;
memory cells arranged in intersecting positions between the upper interconnections and the lower interconnections, the memory cells being laminated in a direction perpendicular to a substrate surface of a semiconductor substrate into a 3-dimensional structure by alternately laminating the plural upper interconnections and plural lower interconnections;
first dummy cells arranged in intersecting positions between the first dummy upper interconnection and the lower interconnections; and
a control circuit that applies a first voltage to a selected one of the upper interconnections, applies a second voltage to an unselected one of the upper interconnections, applies a third voltage to the first dummy upper interconnection and independently controls the first to third voltages to be set to different values.

15. The device of claim 14, wherein the control circuit controls the third voltage to be set between the first and second voltages to make constant a ratio of currents flowing through the unselected memory cell and the first dummy cell.

16. The device of claim 14, further comprising a first dummy lower interconnection arranged in a same level as the lower interconnections and having line width larger than that of the lower interconnection; and second dummy cells arranged in intersecting positions between the upper interconnections and the first dummy lower interconnection,
wherein the control circuit applies a fourth voltage to the selected lower interconnection, applies a fifth voltage to the unselected lower interconnection, applies a sixth voltage to the first dummy lower interconnection and independently controls the fourth to sixth voltages to be set to different values.

17. The device of claim 16, wherein the control circuit controls the sixth voltage to be set between the fourth and fifth voltages to make constant a ratio of currents flowing through the unselected memory cell and the second dummy cell.

* * * * *